US007496877B2

United States Patent
Huber et al.

(10) Patent No.: US 7,496,877 B2
(45) Date of Patent: Feb. 24, 2009

(54) ELECTROSTATIC DISCHARGE FAILURE AVOIDANCE THROUGH INTERACTION BETWEEN FLOORPLANNING AND POWER ROUTING

(75) Inventors: Andrew D. Huber, Poughkeepsie, NY (US); Ciaran J. Brennan, Essex, VT (US); Paul E. Dunn, Cambridge, VT (US); Scott W. Gould, South Burlington, VT (US); Lin Lin, Poughkeepsie, NY (US); Erich C. Schanzenbach, Dover Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 607 days.

(21) Appl. No.: 11/202,275

(22) Filed: Aug. 11, 2005

(65) Prior Publication Data

US 2007/0035900 A1 Feb. 15, 2007

(51) Int. Cl.
*G06F 17/50* (2006.01)
(52) U.S. Cl. .................. 716/8; 716/1; 716/9; 716/10
(58) Field of Classification Search ............... 716/1–14
See application file for complete search history.

(56) References Cited

U.S. PATENT DOCUMENTS

| 4,988,636 | A | * | 1/1991 | Masleid et al. ............. 438/129 |
| 5,552,333 | A | * | 9/1996 | Cheung et al. ............. 438/129 |
| 5,796,638 | A | * | 8/1998 | Kang et al. ..................... 716/5 |
| 6,725,439 | B1 | * | 4/2004 | Homsinger et al. ........... 716/12 |
| 6,823,502 | B2 | * | 11/2004 | Wingren et al. ................ 716/9 |
| 7,065,728 | B2 | * | 6/2006 | Bakir et al. ..................... 716/8 |
| 7,073,147 | B2 | * | 7/2006 | Ikeda et al. ..................... 716/9 |
| 7,076,757 | B2 | * | 7/2006 | Hirata ........................ 716/10 |
| 7,350,160 | B2 | * | 3/2008 | Perez et al. ..................... 716/1 |
| 2006/0075368 | A1 | * | 4/2006 | Bakir et al. .................. 716/10 |

* cited by examiner

*Primary Examiner*—Sun J Lin
(74) *Attorney, Agent, or Firm*—H. Daniel Schnurmann

(57) ABSTRACT

An integrated system and method to achieve ESD robustness on an integrated circuit (IC) in a fully automated ASIC design environment is described. Electrical characteristics and electrical limits on the power network are translated to power route region constraints for each chip input/output (I/O) cell. Electrical limits on the signal network are translated into signal route region constraints for each chip I/O cell. These constraints are passed on to an I/O floorplanner (automatic placer of I/O cells) that analyzes trade-offs between these constraints. For I/O cells that can not be placed to satisfy both power and signal region constraints, the I/O floorplanner utilizes the knowledge of alternative power distribution structures to group I/Os and create local power grid structures that have the effect of relaxing the power region constraints. Instructions for creating these local power grid structures are passed on to the automatic power routing tool.

18 Claims, 7 Drawing Sheets

ELECTROSTATIC DISCHARGE FAILURE AVOIDANCE THROUGH INTERACTION BETWEEN FLOORPLANNING AND POWER ROUTING

BACKGROUND OF THE INVENTION

The present invention generally relates to the design of integrated circuits, and more particularly, to a method for improving a floorplanning layout that provides electrostatic discharge (ESD) robustness to an Application Specific Integrated Circuit (ASIC) design system.

It is known in the art that electrostatic discharge protect devices, such as ESD clamps, connected to integrated circuit (IC) chip input/output (I/O) pads protect circuits from ESD damage. ESD damage typically results from an ESD between any two chip pads. Conventional ESD clamps were designed and located based on well understood requirements of the particular circuit or cell and the physical characteristics of the chip technology and the ESD clamp. Thus, for a single power supply chip, the ESD clamp is typically a pair of reverse biased diodes, each connected between the supply or its return line (ground) and an IC chip signal pad.

The level of protection afforded by prior art ESD clamps is determined by the pad to ESD clamp wiring and the circuit attached to the pad. The design objective is to insure that the ESD clamp turns on prior to the circuit or wiring to the circuit failing. Thus, wiring between the pad and the ESD clamp must be sufficiently wide to transfer the charge to the clamp without failing during the transfer. However, even for a wide wire, if its resistance is too high due to its length, the combination of the resistance and wiring added to the ESD clamp capacitance filters the charge provided to the ESD clamp, reducing its effectiveness. Under certain circumstances, the wiring resistance in the I/O net wiring acts as a voltage divider. If the pad to clamp resistance is too high, the voltage dropped across the divider resistance may prevent the clamp from ever turning on.

Referring to FIG. 1, there is shown a schematic diagram illustrating a resistive network of the power grid model connecting I/O cell 60 and ESD clamp 70 to the chip power grid 50. The resistive network is a linearized current-voltage model as used by an ESD analysis program to detect occurrences of pad to clamp resistances that may inhibit the proper functioning of the ESD clamp. For each ESD clamp device, a voltage source 20 and a series resistor 25 are inserted into the network. During analysis, a current from a simulated Charged Device Model (CDM) discharge is inserted (ESD_CUR 30). The ESD analysis program uses the current to analyze the voltage drop 10 due to the resistance across the power bus from I/O power pin 40 to the chip power grid 50, and flags a voltage drop that is greater than a predetermined limit (ESD_LIMIT).

With the shrinking of technology scaling from 130 nm to 90 nm and beyond, a new level of challenge is introduced to achieve adequate protection against electrostatic discharge (ESD) for CMOS integrated circuits. Technology scaling has brought with it very low breakdown voltages in CMOS circuits. In the 90 nm node, these breakdown voltages fall below 10 V for transient stresses of short duration as it typically occurs in a Charged Device Model (CDM) discharge. A CDM event happens when a device becomes charged (e.g., by sliding down a feeder) and discharged by coming into contact with a conductive surface. A rapid discharge occurs from the device to the conductive object.

At the same time, advances in IC technology have increased the circuit density which has led to a corresponding increase in the number of pads for off-chip connections, i.e., for chip input/outputs (I/Os) and for supplying power and ground to the chip according to what is well known in the art as Rent's Rule.

A 90 nm ASIC design system typically handles in excess of 1500 I/Os and in excess of 200 analog and high speed serial cores. The problem is even more challenging than in previous technologies due to the shear quantity of I/Os and cores, design system complexity, and the number of tape-outs, as described, e.g., by Ciaran J. Brennan, Joseph Kozhaya, Robert Proctor, Jeffrey Sloan, Shunhua Chang, James Sundquist, Terry Lowe, in an article entitled "ESD Design Automation for a 90 nm ASIC Design System", published in the Proceedings of the $26^{th}$ EOS/ESD Symposium, 2004.

In an ASIC environment, many aspects of the design must be automated at the cell and chip level to achieve the necessary efficiency and quick turn-around-time (TAT) needed to support high volume of tape-outs. As a result, it becomes necessary to increase the level of design automation for ESD to ensure adequate protection against ESD failures such that they do not adversely affect the TAT of ASIC chips.

The aforementioned problem is not novel. Several approaches have been proposed, as for instance, in U.S. Pat. No. 6,725,439, that describes a method of providing ESD protection to an integrated circuit (IC) chip. Placing maximum resistance and minimum wire width constraints on I/Os and ESD signal nets ensures ESD protection when all the I/O-to-chip-pad routing constraints are satisfied. The design tools adhering to these routing constraints also verify that all the I/O-to-chip-pad routing constraints are met. Further, checking is performed to secure that the power supply and ground lines are properly connected to ESD clamps. However, the methodology described therein fails to optimize the I/O placement to meet ESD power supply targets. Neither does it place I/Os in close proximity of each other to share local power bus connections. Thus, the method described checks for the length and width constraints on the I/O to ESD connections, and fails to solve the problem associated with ESD placement.

U.S. patent application Ser. No. 10/711,633 describes a method for accurately and efficiently checking the electrical chip-level power to guarantee the ESD reliability of VLSI ASIC chips. Further described is an ESD book placement scheme wherein the chip is divided into sections, an ESD book is placed at the "center of mass" thereof, and an ESD verification is performed to determine whether all the I/Os meet predetermined ESD targets. Provisions are made to eliminate any I/Os failing to achieve the stated targets due to unsatisfactory placement or wiring. If I/Os are found not to meet the targets in a given section, the ESD book is removed. The section is then subdivided into smaller sections, placing the ESD book in each section, and repeating the check. The process of subdividing continues until all the I/Os are accounted for. Further discussed is a method for performing an ESD check by applying a current, calculating the voltage drop, and comparing it to a predetermined limit. The method begins by placing all I/Os and creating an ESD placement solution. Some of the I/O cells may fail ESD because they rely on power routing to the chip power grid on last metal from both I/O and ESD cells. The cited reference does not discuss I/O placements nor the process for optimizing the I/O placement to meet ESD targets. Neither are discussed providing local connections between nearby I/Os, nor placing an ESD book having local connections to the I/Os.

Thus, there is a need in industry to provide integrated circuits with a robust ESD protection, and for a method and a system for designing chips and ASICs that optimally place the I/Os meeting stringent ESD targets.

OBJECTS AND SUMMARY OF THE INVENTION

Accordingly, it is an object of the invention to eliminate potential ESD failures in an IC chip or ASIC design, in order to avoid finding and repairing such problems late in the design cycle that result in unacceptable delays.

It is another object to avoid ESD failures in a floorplanning layout by providing a method that passes the constraints between power analysis and power routing to and from the I/O floorplanner.

It is still another object to provide a method that derives distance constraints from electrical constraints and further combines the formulation of floorplanning region constraints from I/O electrical characteristics and electrical limits.

It is a further object to check and verify the electrostatic discharge robustness of the ASIC design system by translating constraints on a power grid to floorplanning constraints.

It is yet another object to provide a method that links the power routing to the constraints from the I/O floorplanner while performing electrical checks on the power grid, allowing an increase of width constraints on failing connections.

These and other objects, advantages and aspects of the invention are satisfied by a method for automatically curtailing power and signal problems by assessing trade-offs between I/O resistance, ESD limits, IR drop limits, and routing congestion; selecting optimal signal wire and power structures from a set of alternatives; grouping the I/Os to achieve power grid optimization and/or routing congestion minimization; inserting ESD clamps if no other solution is found; and generating constraints and instructions to the power router.

The present invention translates multiple electrical constraints on the power distribution network (ESD-resistance and IR drop constraints) into distance constraints that are more easily understood by the I/O floorplanner. Methods of translation are also established based on the analysis of all types of I/Os (including high and low power I/Os).

The present invention enables the I/O floor planner to take both the signal and power routing constraints into consideration, in contrast with the prior art where the I/O floorplanner focuses only on signal routing constraints. The invention further provides intelligent placement in the I/O floorplanner, balancing distance and wire width constraints on the power network with distance and wire width constraints on the pad transfer signal network. The I/O floorplanner also generates distance and wire width assessments for the I/Os failing to satisfy all the constraints.

In another aspect of the invention, the ESD protection design flow turn-around time (TAT) is significantly improved by including an I/O placement assessment step as part of the I/O floorplanning. This assessment determines which I/Os fail the distance constraints on the power network and creates instructions for creating localized power grids and/or constraints on the power connections to be passed on to the power router for consideration.

In still another aspect of the invention, there is provided a method that takes into consideration the IR drop and ESD constraints during the I/O floorplanning, where it is likely that a number of I/Os may fail either the ESD or the IR drop limits during the power analysis phase. The invention provides a feedback mechanism from the power analysis to the I/O floorplanner. (Prior to the invention, ESD and IR drop failures found by power analysis had to be repower routed by way of a wider, lower resistance route or fixed by manually moving I/Os). The aforementioned feedback mechanism to the I/O automatic placer also accounts for power width constraints during the automatic placement, thus providing a faster repair TAT.

In summary, the present invention provides an integrated system approach to achieve ESD robustness, ensuring consistent performance through an ESD event in a fully automated ASIC design environment that spans from the layout and wiring to the ESD verification, with appropriate feedback from the ESD checker to the I/O floorplanner. The resulting optimized I/O placement taken in conjunction with the automatically generated power routing constraints (e.g., wire width) are then propagated through different stages of the design. In this manner, the design TAT is greatly improved while it also provides an adequate ESD protection for the 90 nm ASIC technology and beyond.

BRIEF DESCRIPTION OF THE DRAWINGS

These and other objects, aspects and advantages of the invention will be better understood from the detailed preferred embodiment of the invention when taken in conjunction with the accompanying drawings.

DETAILED DESCRIPTION

Figure 2:
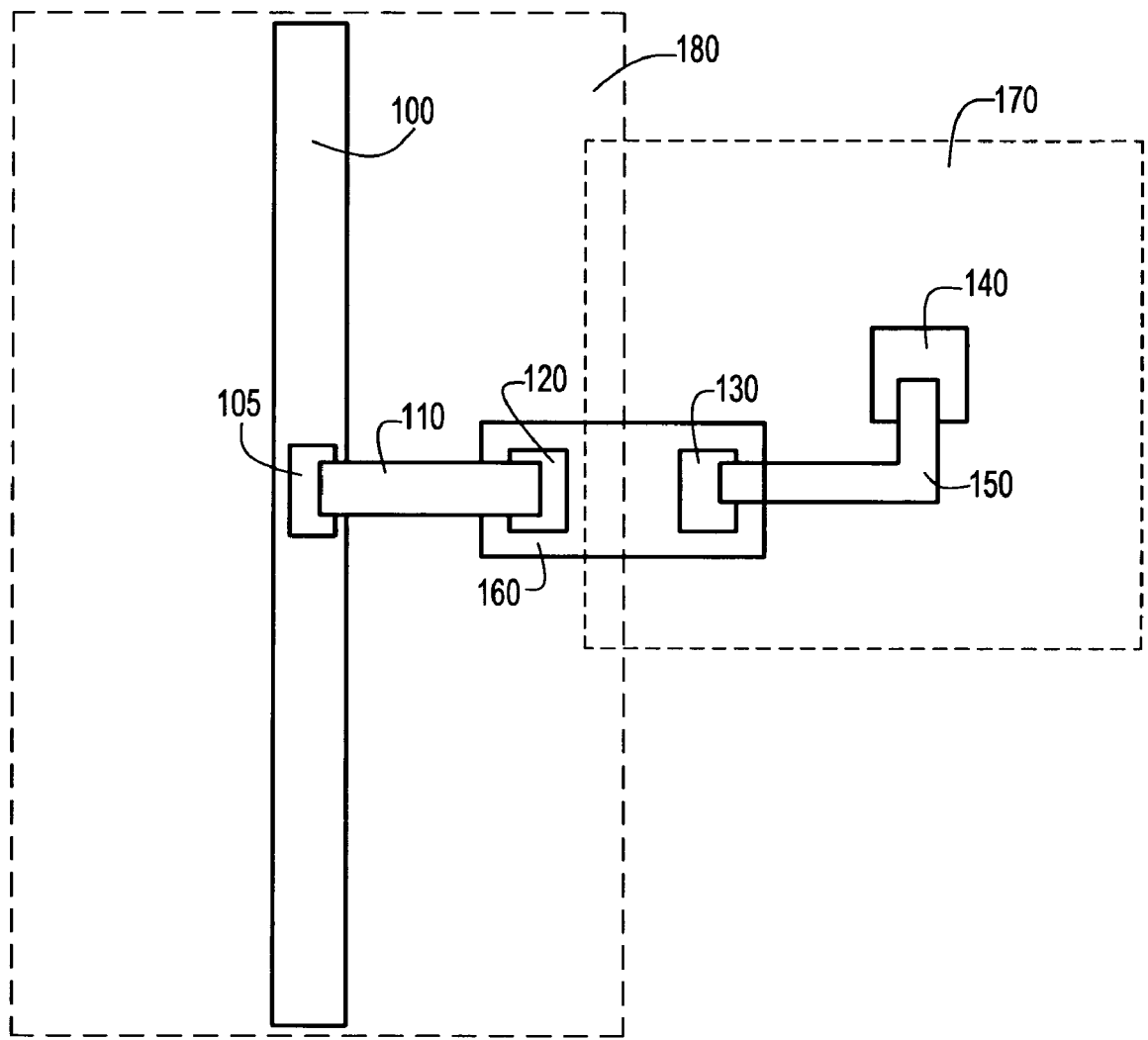
FIG. 2 is a schematic diagram illustrating power route regions and signal route regions that are derived from electrical characteristics and limits on the power bus and signal route networks.

FIG. 2 is a schematic diagram illustrating the terms used in the description of the present invention.

Input/output (I/O) cell 160, also known as an off-chip driver/receiver, includes a power pin 120 that is connected by way of a power bus route 110 to a chip power grid rail 100. Because the power bus route and the chip power grid are on different metal layers, the power bus route is connected to the chip power grid through power via 105 that spans across two metal layers. I/O cell 160 also includes signal pad 130 that is connected by way of signal route 150 to a chip C4 pad 140. The objective is to minimize the resistance through the power route 110 connection to avoid failures due to the electrostatic discharge (ESD) events.

Figure 3:
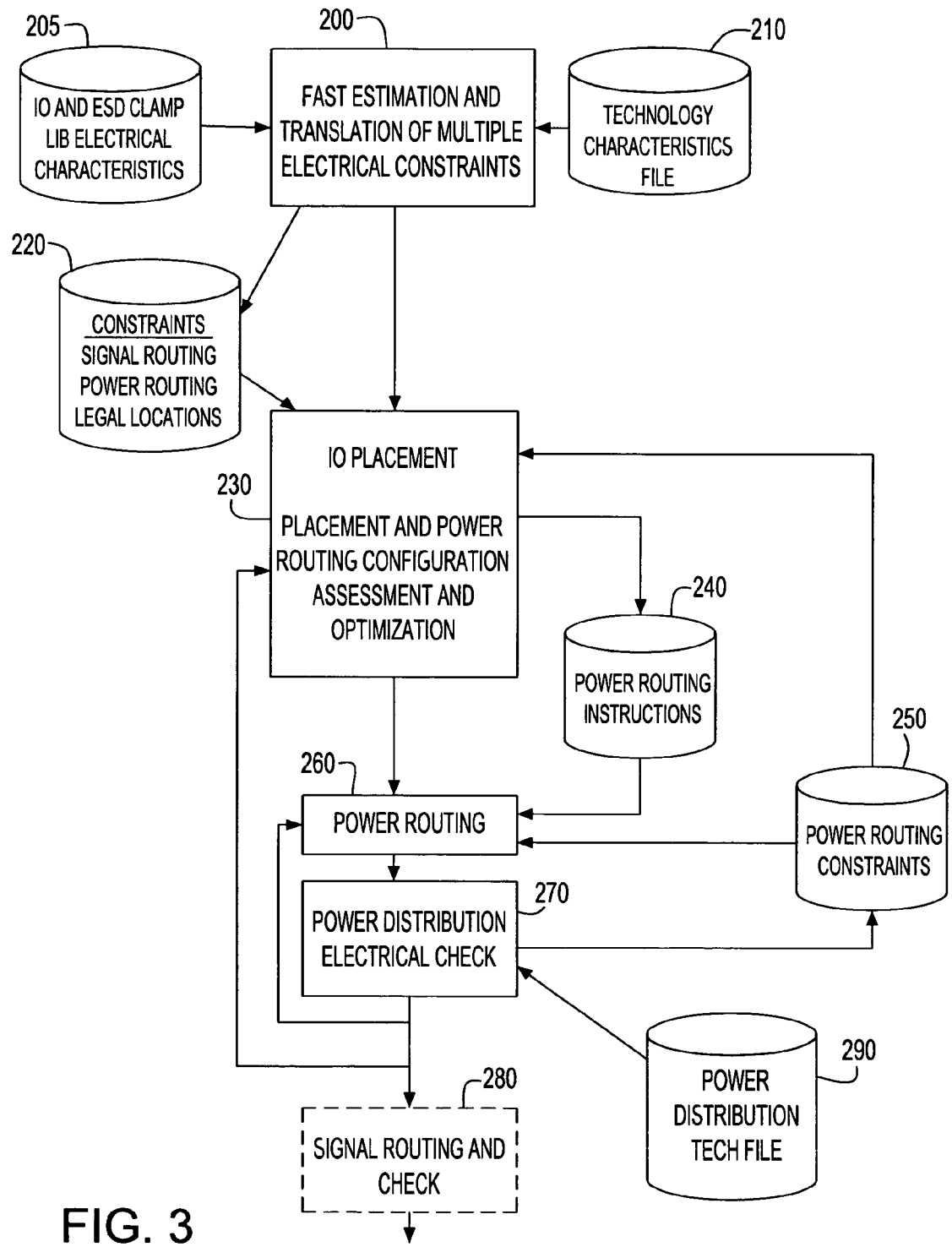
FIG. 3 is a diagram that illustrates the method of the present invention for placing I/O cells and designing the power distribution of the VLSI chip, wherein major elements of the invention are italicized.

FIG. 3 is a diagram illustrating the method used for placing I/O cells and designing the power distribution of the chip incorporating the elements of the invention. In step 200, I/O circuit and ESD clamp electrical characteristics from technology library 205 are combined with generic technology power distribution electrical characteristics obtained from technology specification file 210 and translated into power route distance constraints suitable for use in an I/O automatic placement. These power route distance constraints are combined with signal route distance constraints and placement verification constraints 220 and fed to the I/O placement step 230. Automatic I/O placement 230 places the I/O cells subject to power, signal, and legal location constraints 220. In addition to the placement of I/O cells, the automatic I/O placer 230 also groups and stacks I/O cells by taking advantage of the knowledge that the power router 260 capabilities create localized power distribution networks to minimize the resistance on the power network. The I/O placement step 230 creates power routing instructions 240 that are fed to the power routing step 260. In the power routing step 260, connections are made from the I/O cell power pins to the chip power grid. In the power distribution electrical checking step 270, the chip power distribution, including the chip power grid and connections from the I/O cells to the chip power grid, is checked to ensure that all the power connections satisfy the IR drop, electro-migration, and electrostatic discharge (ESD) limits. In the event of failures detected during the execution of power distribution checking step 270, power routing constraints 250 are generated that feed back to either the I/O placement 230 or the power routing 260 steps for refinement of I/O placement and/or power routing.

Figure 4:
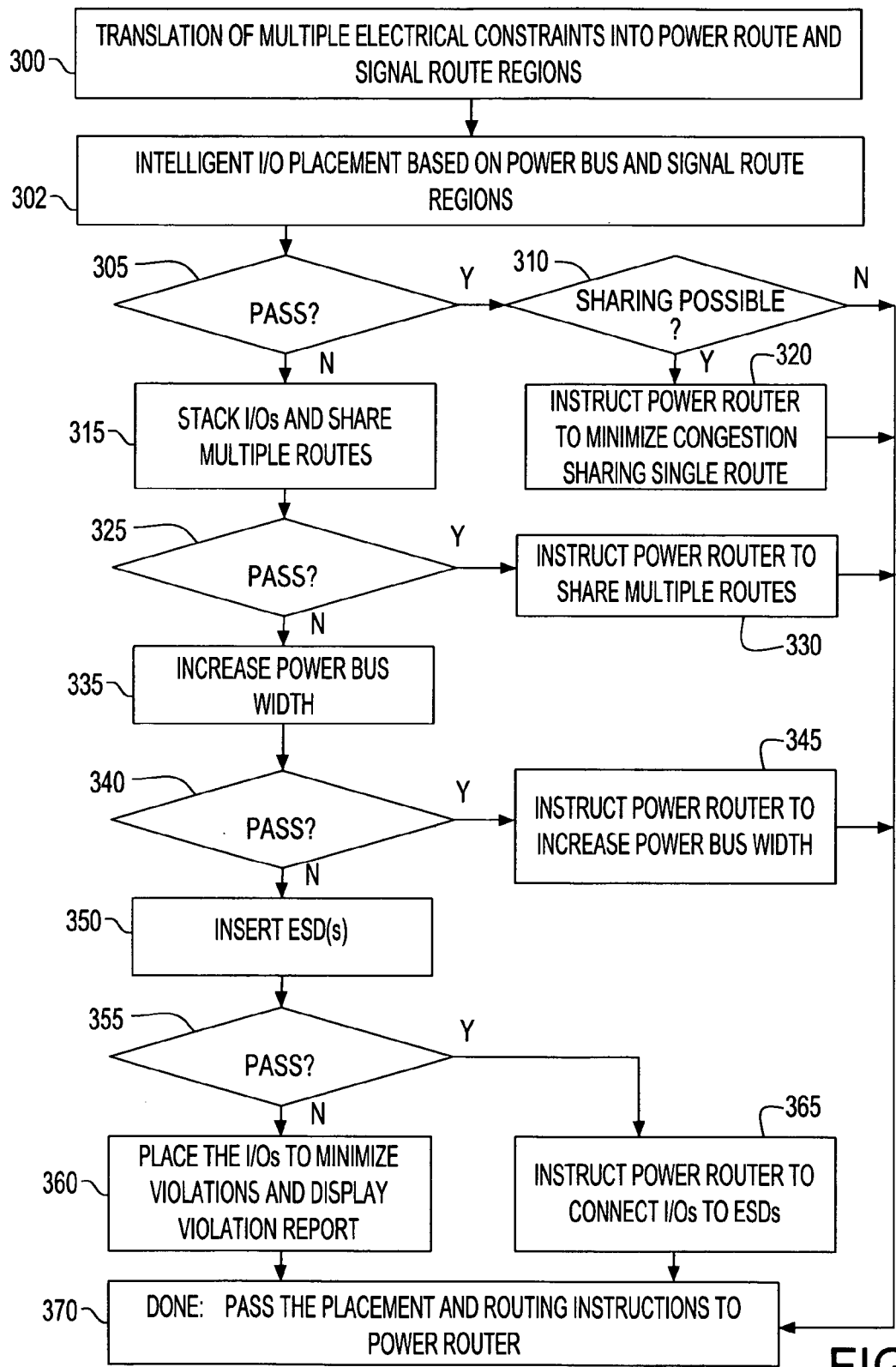
FIG. 4 is a flowchart of a detailed intelligent automatic I/O placement with power routing assessment and optimization, in accordance with the invention.

FIG. 4 is a flowchart illustrating the I/O placement methodology of the present invention as shown in step 230, FIG. 3. The flowchart provides additional details of the I/O placements including a power routing configuration assessment and optimization. In step 300, electrical characteristics and limits on the power network are converted into constraining power bus regions and electrical characteristics, and limits on the signal network are converted into constraining signal route regions.

Figure 1:
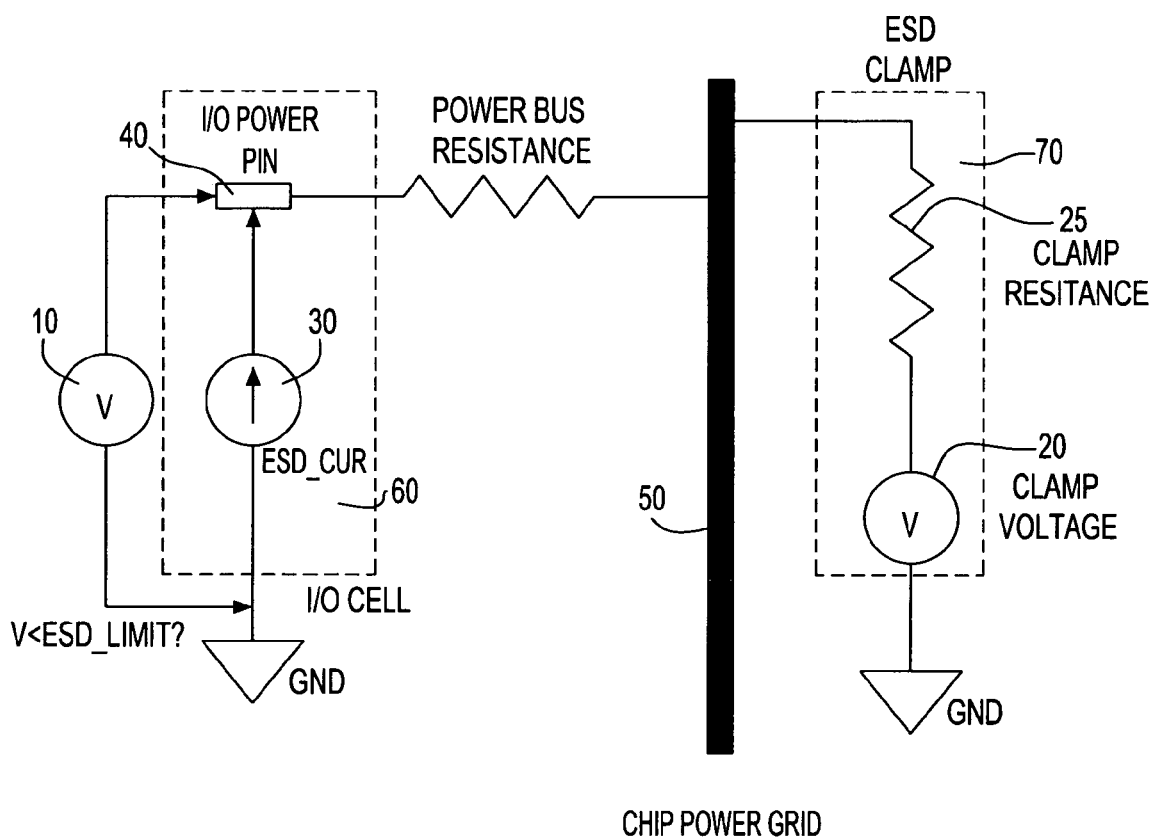
FIG. 1 is a schematic diagram illustrating a conventional electrical I/O cell and ESD clamp with the electrical characteristics and limits that are converted to power bus route distance constraints.

Referring back to FIG. 2, to determine the constraining power bus region 180 for I/O cell 160, the maximum power bus route 110 length is first determined for connecting its I/O power pin 120 to rail 100 on the chip power grid. Referring back to FIG. 1 that illustrates the electrical characteristics and limits for deriving the maximum power bus length, the maximum power bus length is determined by way of the equation:

$$MAXLG = RESFRAC*(ESD_{LIM} - CLAMP\_VOLT - ESD_{CUR}*(CLAMP\_RES + PWR\_VIA_{RES}))/(ESD_{CUR}*RES\_PER_{LG}), \text{ wherein}$$

MAXLG is the maximum length of a power route connecting an I/O cell power pin 40 to a rail 50 on the chip power grid.

RESFRAC is the percentage of the total resistance allocated to the power bus route obtained from the technology characteristics file 210, FIG. 3.

ESD_LIM is the maximum voltage 10 allowed on the power net for an I/O cell 60 during a CDM event as determined by circuit simulation and specified in the I/O cell circuit file 205, FIG. 3.

CLAMP_VOLT is the turn-on voltage 20 for the ESD clamp 70 also determined from circuit simulation and which is specified in the ESD clamp circuit file 205, FIG. 3.

ESD_CUR is the peak current 30 injected onto the power net from the I/O cell 60 during a CDM event, which is likewise specified in the I/O cell circuit file 205, FIG. 3.

CLAMP_RES is the resistance 25 of the ESD clamp 70 as determined from simulation of the circuits and specified in the ESD clamp circuit file 205, FIG. 3.

PWR_VIA_RES is the resistance through the connector (power via 105, FIG. 2) between the metal layer containing the power bus route and the metal layer containing the rail 50 on the chip power grid. The power via resistance is obtained from the technology characteristics file 210, FIG. 3.

RES_PER_LG is the resistance per unit length for the power bus route that connects the I/O cell power pin 40 to the rail 50 on the chip power grid and is further derived from the following equation:

$$RES\_PER_{LG} = SHEET_{RES}/(HOLE_{MULT}*POWER\_BUS\_WIDTH + HOLE\_ADD), \text{ wherein}$$

SHEET_RES is the resistance per square of metal for the layer containing the power bus route and is obtained from the technology characteristics file 210, FIG. 3.

HOLE_MULT is a fractional resistance multiplier, and HOLE_ADD is a resistance adder that accounts for the insertion of small holes filled with oxide in wide metal wires to improve the manufacturing process. HOLE_MULT and HOLE_ADD are obtained from the technology characteristics file 210, FIG. 3.

POWER_BUS_WIDTH is the width of the power bus used to connect the I/O cell power pin 40 to the rail 50 on the chip power grid.

Still referring to FIG. 2, a constraining power bus region is derived from the maximum length of the power bus route. Each rail 100 on the chip power grid is first located. The constraining power bus region 180 is then formed by enclosing the rail in a rectangle. The distance of each edge of the rectangle from the rail is the maximum length of the power bus route as computed in the equation above.

To determine the constraining signal route region 170 for a given I/O cell 160, the maximum signal route length for connecting the I/O cell signal pad pin 130 to the chip signal C4 140 is first determined. The maximum signal route length is derived from the following equation:

$$MAXLG = IO_{RES\_LIM}/RES\_PER_{LG}, \text{ wherein:}$$

MAXLG is the maximum length of the signal route 150 connecting an I/O cell signal pin 130 to the chip signal C4 140.

IO_RES_LIM is the maximum resistance on the signal net for an I/O cell as specified in the I/O cell circuit file 205, FIG. 3.

RES_PER_LG is the resistance per unit length for the signal route 150 that connects the I/O cell signal pin 130 to the chip signal C4 140 and is obtained from the technology characteristics file 210, FIG. 3.

Still referring to FIG. 2, a constraining signal route region 170 is then derived from the maximum length of the signal route 150. The chip signal C4 140 to which the I/O signal pin 130 is connected to is located. The constraining signal route region 170 is then formed by enclosing the chip C4 140 in a rectangle. The distance of each edge of the rectangle from the chip C4 is the maximum length of the signal route as computed by the equation above.

In step 302 in FIG. 4, automatic placement of I/O cells is performed subject to the constraining power route and signal route regions computed in the previous step 300.

Figure 5:
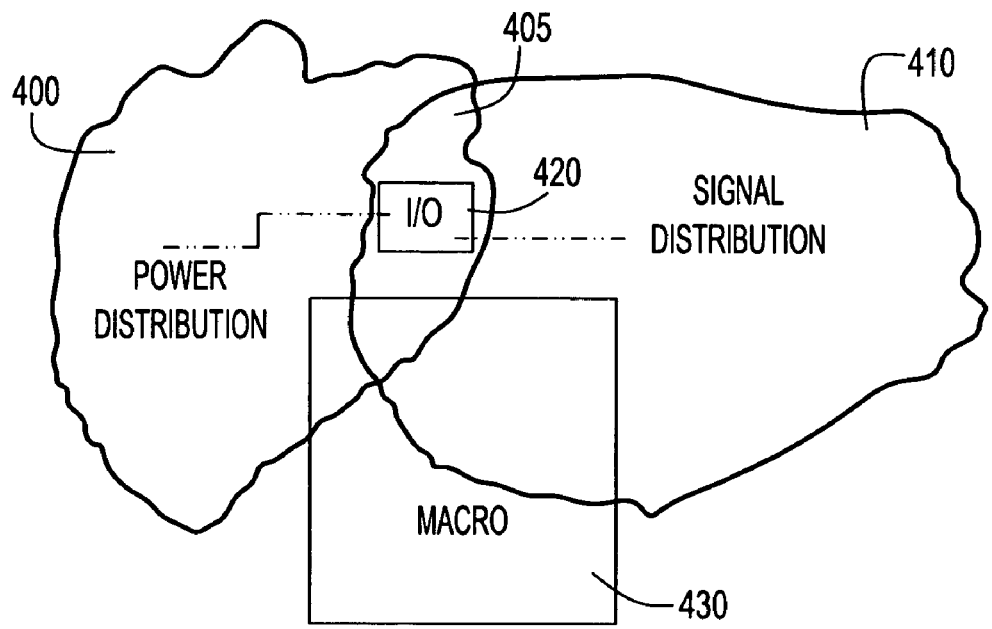
FIG. 5 shows a first illustrative example of overlapping regions. The area of intersection represents the region where an I/O is placed to satisfy both power net constraints and signal net constraints.

Referring now to FIG. 5, there is shown a schematic diagram illustrating the operation performed in step 302. A region 400 where power net constraints are met is determined for a given I/O cell 420. A second region 410 where signal net constraints are met is determined for the same I/O cell 420. If the regions overlap, the I/O cell is placed in the region of overlap 405. Note that the overlap region for placement 405 may be further restricted by macro cell 430 that was placed prior to the I/O cell. In step 305, FIG. 4, each I/O cell is checked to ensure that it is placed in a location that satisfies the power routing, signal routing, and legal location constraints. For an I/O cell meeting all the constraints, it is determined whether one or more I/O cells may be placed such that they share a single power route (step 310). If one or more such I/O cells is found, the I/Os are grouped and stacked, and an instruction is generated instructing the power router to connect the stacked I/Os to the chip power grid using a single route, thereby improving the signal routing congestion (step 320).

Figure 6:
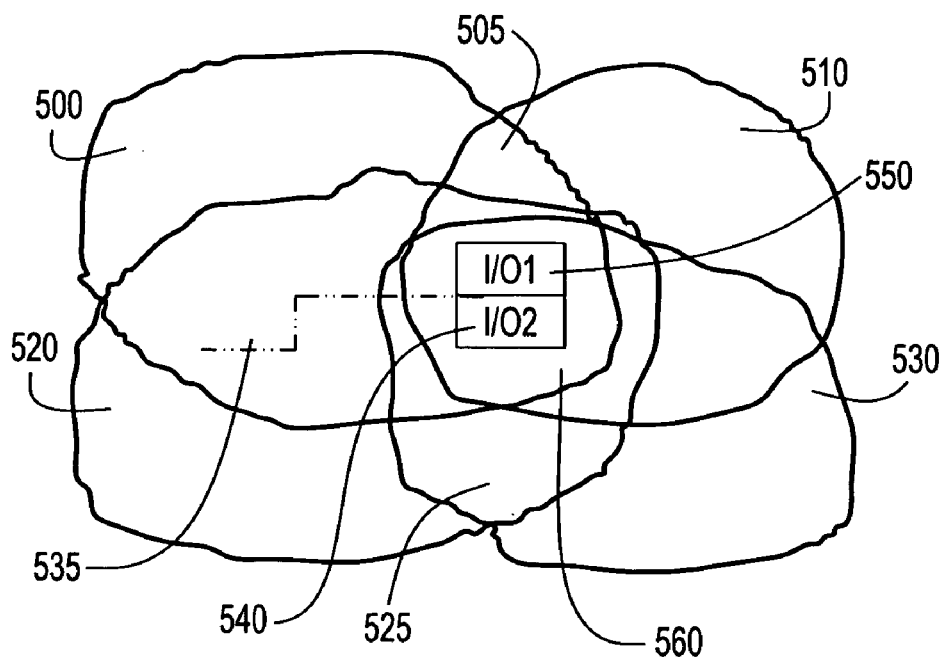
FIG. 6 shows a second example illustrating the process of minimizing signal routing congestion by grouping and stacking I/Os such that I/Os in the stack share a single power route. All I/Os in the stack are shown sharing a common region of overlap.

Referring to FIG. 6, there is shown a schematic diagram illustrating the operations performed in steps 310 and 320. I/O cell 1 550 is provided with region 500 where the I/O cell is to be placed and which meets power routing constraints, and region 510 where the I/O cell meets the signal routing constraints. I/O cell 1 550 is placed in the region of overlap 505 between regions 500 and 510. The list of other I/O cells is searched. An I/O cell 2 540 having region 520 is found where it meets the power routing constraints, and region 530 where it meets the signal routing constraints. These regions overlap forming region 525 where I/O cell 2 540 may be placed. Furthermore, region 505 where I/O cell 1 550 is placed overlaps with region 525 where I/O cell 2 540 is placed, forming region 560 where both I/O cells may be placed. Automatic I/O placement groups I/O cell 1 550 and I/O cell 2 540 places them within region 560, and instructs the power router to share a single power route 535 between these two I/O cells.

In step 305, FIG. 4, if a placement cannot be found for an I/O cell that meets all the signal routing, power routing, and legal location constraints, then the I/O placement program proceeds to step 315. In step 315, the automatic I/O placement tool searches for other I/O cells that are stacked such that multiple routes are shared, thereby increasing the distance at which each I/O may be placed at away from the chip power grid. If one or more such I/O cells are found (step 325), the I/O placement tool stacks and places the I/O cells, generating instructions for the power router instructing it to create a local grid over the stacked I/O cells and multiple routes connecting to the chip power grid (step 330).

Figure 7:
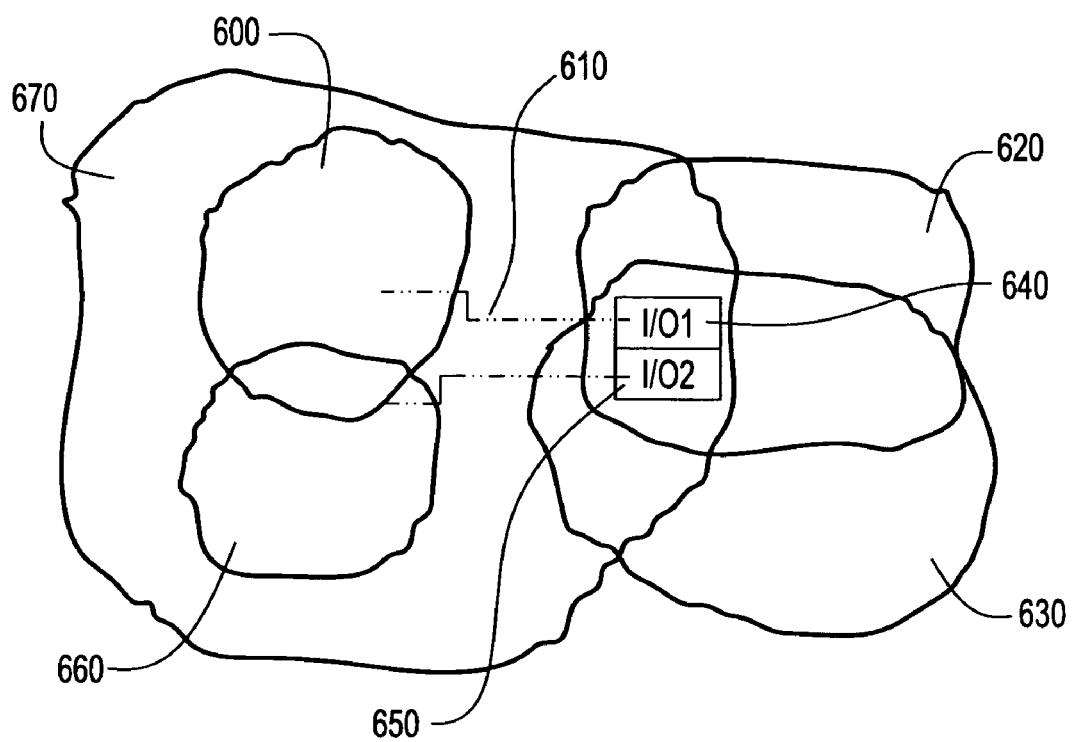
FIG. 7 is a third example illustrating how I/Os are stacked and multiple power routes are shared.

Referring to FIG. 7, a schematic diagram is shown to illustrate the operations performed in steps 315, 325, and 330. I/O Cell 1 640 has region 600 where the I/O cell satisfies the power routing constraints, and region 620 where the I/O cell satisfies the signal routing constraints. Regions 600 and 620 do not overlap, indicating that there is no region where I/O Cell 1 640 may be placed on its own to satisfy both the signal and the power routing constraints. Similarly, I/O Cell 2 650 has region 660 where it satisfies the power routing constraints and region 630 where it satisfies the signal routing constraints. Regions 660 and 630 do not overlap, indicating that there is no region where I/O Cell 2 650 may be placed on its own that satisfy both the signal and power routing constraints. I/O cell 1 640 and I/O cell 2 650 are stacked so that they can share multiple power routes. The sharing of power routes decreases the resistance on the power network, thereby creating an expanded region 670 where the I/O cells may be placed to satisfy power routing constraints. The I/O placement tool groups and stacks I/O cell 1 640 and I/O cell 2 650 and places the stack at the intersection of regions 620, 630, and 670.

In step 325, FIG. 4, if stacking of I/O cells and sharing of power routes does not provide a solution that satisfies the power routing, signal routing and legal location constraints, the I/O placement program proceeds with step 335. Therein, the I/O placement tool increases the power route width subject to the widths allowed by the technology rules. The increase in power route width reduces the resistance on the power network, increasing the allowable distance from an I/O cell to the chip power grid. If increasing the power route width permits an I/O cell placement that satisfies the power routing, signal routing, and legal location constraints (step 340), the I/O placement tool places the I/O cell and creates instructions for the power router instructing it to create a power route with a new width (step 345).

Figure 8:
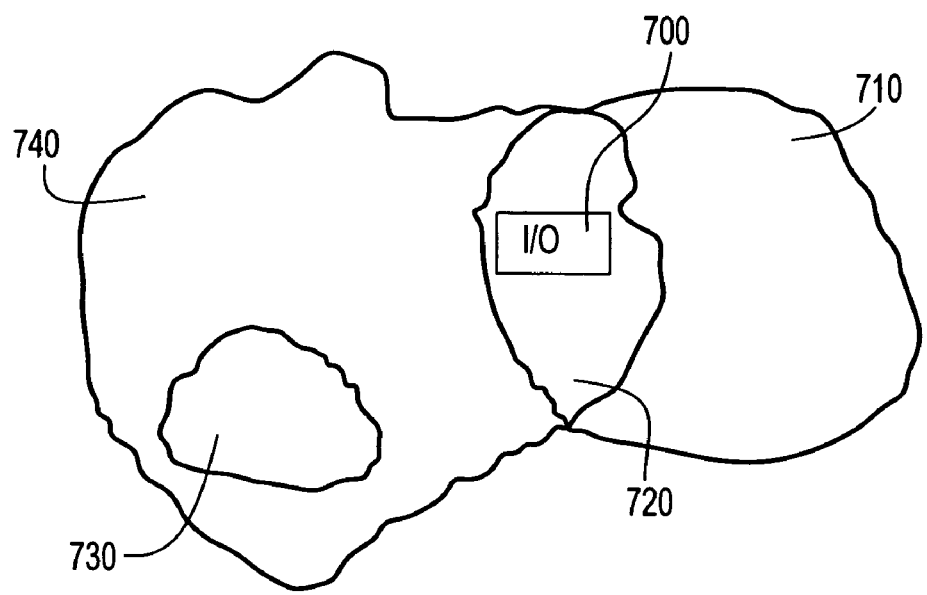
FIG. 8 is a fourth example illustrating the process of increasing the width of a power route.

Referring now to FIG. 8, there is shown a schematic diagram illustrating the operations performed in steps 335, 340, and 345. I/O Cell 700 has region 730 where it satisfies the power routing constraints and region 710 where it satisfies the signal routing constraints. Regions 730 and 710 do not overlap, indicating that there is no region where I/O Cell 700 may be placed given the current power route width. The I/O placement tool then increases the power width, decreasing the resistance on the power network, thereby expanding the region 740 where the I/O cell 700 may be placed to satisfy the power routing constraints. The expanded region 740 now overlaps with region 710 forming region 720 where the I/O cell satisfies both the signal and the power routing constraints. The I/O placement tool places the I/O cell 700 in region 720 and generates instructions to the power router that instruct it to use a wider route to connect the I/O to the chip power grid. The increase in power route width lessens the resistance on the power network for the given I/O, providing a larger region in which the I/O may be placed to satisfy power the net constraints.

In step 340, FIG. 4, if increasing the width of the power route connecting the I/O cell to the chip power grid does not provide for a solution that satisfies the power routing, the signal routing and the legal location constraints, the I/O placement program then proceeds with step 350. In step 350, the I/O placement tool inserts an electrostatic discharge clamp protection device (i.e., an ESD clamp) and groups it with the I/O cell. If inserting the ESD cell and stacking it with the I/O cell allows for an I/O cell placement that satisfies power routing, signal routing, and legal location constraints (step 355), the I/O placement tool inserts the ESD cell, placing the I/O cell and ESD cell in a stack and creating instructions for the power router that tell it to connect the I/O cell to the ESD cell (step 365).

Figure 9:
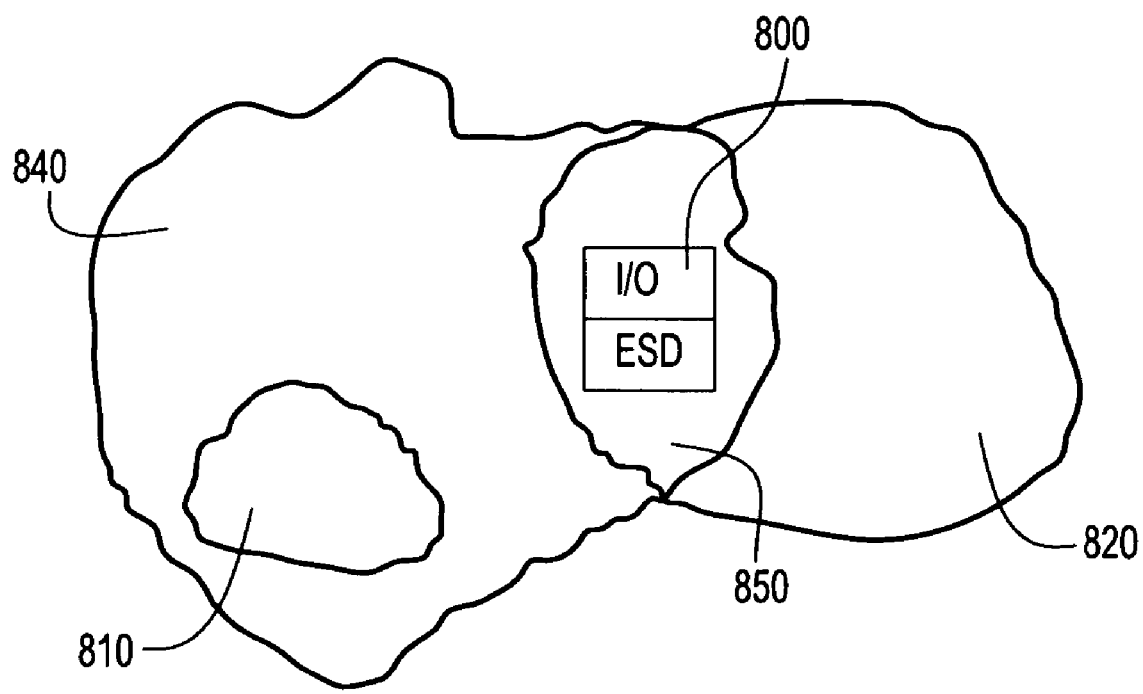
FIG. 9 is a fifth example illustrating the insertion of an ESD clamp protection device and stacking with an I/O that fails the power net constraints.

Referring now to FIG. 9, there is shown a schematic diagram illustrating the operations performed in steps 350, 355, and 365. I/O Cell 800 has region 810 where it can be placed such that it satisfies the power routing constraints and region 820 such that it satisfies the signal routing constraints. Regions 810 and 820 do not overlap, indicating that there is no region where I/O Cell 800 may be placed to satisfy both power routing and signal routing constraints. The I/O placement tool then inserts an ESD cell 830, thereby increasing the region 840 where the I/O cell may be placed to satisfy power routing constraints. The expanded region 840 now overlaps with region 820 forming region 850 where the I/O cell may be placed to satisfy both signal and power routing constraints. The I/O placement tool places the I/O cell 800 in region 850 inserts an ESD cell adjacent to the I/O cell and generates instructions to the power router that tell it to connect the I/O cell 800 to the ESD cell 830. The insertion of a clamp protection device provides for a much larger region in which the I/O is to be placed to satisfy power net constraints.

In step 355, FIG. 4, inserting an ESD cell does not provide a solution that satisfies the power routing, signal routing and legal location constraints. Then, the I/O placement program proceeds to step 360. In step 360, the I/O placement tool places the I/O cell such that it is centered between the region that satisfies power routing constraints and the region that satisfies signal routing constraints. A violation report is issued to let the user know that further action is required. Finally, in step 370, the I/O cell placements and power routing instructions are passed to the power routing methodology step.

In summary, the invention provides avoidance of ESD failures by a method that combines:

1) formulating floorplanning region constraints from I/O and ESD clamp electrical characteristics and electrical limits;

2) using the floorplanning constraints by an I/O floorplanning tool to avoid ESD failures, and furthermore, the knowledge of alternative power distribution structures to group I/Os that create a local power grid to meet ESD constraints;

3) performing an automatic floorplanning assessment to create new routing constraints to pass to the power routing tool;

4) using the routing constraints to avoid ESD failures;

5) verifying the presence of ESD failures; and 6) feeding back the refined constraints to the floorplanner.

While the present invention has been particularly described in conjunction with specific embodiments, it is evident that other alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method for providing electrostatic discharge (ESD) protection to a chip by intelligent placement of I/Os, the method comprising:
   a) converting I/O electrical parameters into power route regions, and I/O maximum resistance constraints into signal route regions;
   b) for each I/O to be placed, forming a constraining region which is constructed by an intersection of one of said power route regions and one of said signal route regions;
   c) stacking all of the I/Os having a common constraining region and assigning thereto a common power route connection; and
   d) placing on the chip each of said stacked I/Os within its respective common constraining region.

2. The method as recited in claim 1, wherein for each I/O lacking a power route region that intersects a signal route region, the method further comprises:
   e) expanding the power route region by stacking the I/Os having intersecting signal route regions and sharing multiple power route regions with each of said stacked I/Os;
   f) for each of said stacked I/Os, determining an intersecting constraining region by an intersection of said expanded power route region with one of said intersecting signal route regions; and
   g) placing on the chip each of said stacked I/Os within its respective intersecting constraining region.

3. The method as recited in claim 2, wherein following step f), for an I/O lacking an intersecting power route region and a signal route region, the method further comprises:
   b1) f1) increasing width constraint of a power route extending from said I/O to a chip power grid, thereby expanding the power route region;
   b2) f2) for each of said I/Os, forming a constraining region which is constructed by an intersection of said expanded power route region and said signal route region; and
   b3) f3) placing on said chip each of said stacked I/Os within its respective constraining region.

4. The method as recited in claim 2, wherein in step e) instructions create a local power grid over the stacked I/O and connect said local power grid to a chip power grid using multiple power route connections that are generated and passed to a power routing step.

5. The method as recited in claim 3, wherein in absence of a valid placement, the method comprises expanding a size of the power route region by inserting an ESD clamp protection device next to said I/O.

6. The method as recited in claim 3, wherein in step f2) instructions increase a width of the power route width connecting said I/O to said chip power grid that are generated and passed to a power routing step.

7. The method as recited in claim 5, wherein in absence of a valid placement, the method further comprises: minimizing violations by placing a failing I/O mid-way between its non-intersecting power route region and its signal route region.

8. The method as recited in claim 5, wherein instructions create a local power grid over said I/O and an adjacent EDS clamp protection device that are generated and passed to a power routing step.

9. The method as recited in claim 1, wherein in step a) said electrical parameters including an ESD clamp voltage and an ESD clamp resistance specified in a technology file.

10. The method as recited in claim 1, wherein in step a) said I/O electrical parameters associated with each type of said I/Os include ESD voltage limits, ESD current limits, and power route width constraints.

11. The method as recited in claim 1, wherein in step a) said I/O electrical parameters associated with the chip comprise:
   a. horizontal and vertical adjacent metal layers for power routing;
   b. sheet resistance for said adjacent metal layers;
   c. via resistance for vias between said adjacent metal layers; and
   d. resistance of adders and multipliers due to a manufacturing process.

12. The method as recited in claim 1, wherein in step a) said converting I/O electrical parameters into power route regions constraints comprises converting said I/O electrical parameters into a maximum length constraint on the power route regions from each I/O to a chip power grid is obtained from equation:

$$MAXLG=RESFRAC*(ESD\_LIM-CLAMP\_VOLT-ESD\_CUR*(CLAMP\_RES+PWR\_VIA\_RES))/(ESD\_CUR*RES\_PER\_LG),$$

wherein MAXLG is maximum length of a power route region connecting an I/O cell power pin to a rail on the chip power grid; RESFRAC is a percentage of total resistance to be allocated to the power route region; ESD_LIM is maximum voltage allowed on a power net for an I/O cell during a CDM event;

CLAMP_VOLT is a turn-on voltage for an ESD clamp; ESD_CUR is a peak current injected onto a power net from the I/O cell during a CDM event; CLAMP_RES is a resistance of an ESD clamp; and PWR_VIA_RES is a resistance through a connector between a metal layer containing the power route and a metal layer containing a rail on the chip power grid; RES_PER_LG is resistance per unit length for the power route connecting the I/O cell power pin to the rail on the chip power grid.

13. The method as recited in claim 12 wherein said converting said I/O electrical parameters into power route regions constraints comprises: enclosing each power rail on said chip power grid in a rectangle wherein each edge is a maximum power distance from the edges of said power rail.

14. The method as recited in claim 1, wherein in step c) instructions create a local power grid over the stacked I/Os and connect said local power grid to a chip power grid using common power route connections that are generated and passed to a power routing step.

15. A system for providing electrostatic discharge (ESD) protection to a chip by intelligent placement of I/Os, the system comprising:
   a) means for converting I/O electrical parameters into power route regions, and I/O maximum resistance constraints into signal route regions;
   b) for each I/O to be placed, means for forming a constraining region which is constructed by an intersection of one of said power route regions and one of said signal route regions region;
   c) means for stacking all of the I/Os having common constraining regions and assigning thereto a common power route connection; and
   d) means for placing on the chip each of said stacked I/Os within its respective common constraining region.

16. The system as recited in claim 15, wherein for each I/O lacking a power route region that intersects a signal route region, the system further comprises:
   e) means for expanding the power route region by stacking the I/Os having intersecting signal route regions and sharing multiple power routes with each of said stacked I/Os;
   f) for each of said stacked I/Os, means for determining an intersecting constraining region by an intersection of said expanded power route region with one of said intersecting signal route region; and
   g) means for placing on the chip each of said stacked I/Os within its respective intersecting constraining region.

17. The system as recited in claim 16, wherein following step f), for an I/O lacking an intersecting power route region and a signal route region, the system further comprises:
   f1) means for increasing a width constraint of a power route extending from said I/O to the chip power grid, thereby expanding the power route region;
   f2) for each of said I/Os, means for forming a constraining region which is constructed by an intersection of said expanded power route region and said signal route region; and
   f3) means for placing on said chip each of said stacked I/Os within its respective constraining region.

18. A program storage device readable by a machine, tangibly embodying a program of instructions executable by the machine to perform method steps for providing electrostatic discharge (ESD) protection to a chip by intelligent placement of I/Os, said method steps comprising:
   a) converting I/O electrical parameters into power route regions, and I/O maximum resistance constraints into signal route regions;
   b) for each I/O to be placed, forming a constraining region which is constructed by an intersection of one of said power route regions and one of said signal route region;
   c) stacking all of the I/Os having a common constraining regions and assigning thereto a common power route connection; and
   d) placing on the chip each of said stacked I/Os within its respective common constraining region.

* * * * *